(12) United States Patent
Horijon

(10) Patent No.: US 7,570,801 B2
(45) Date of Patent: Aug. 4, 2009

(54) DEVICE SUITABLE FOR PLACING COMPONENTS ON A SUBSTRATE

(75) Inventor: Joseph L. Horijon, Eindhoven (NL)

(73) Assignee: Assembleon N.V., La Veldhoven (NL)

( * ) Notice: Subject to any disclaimer, the term of this patent is extended or adjusted under 35 U.S.C. 154(b) by 101 days.

(21) Appl. No.: 11/925,527

(22) Filed: Oct. 26, 2007

(65) Prior Publication Data

US 2008/0130130 A1    Jun. 5, 2008

(30) Foreign Application Priority Data

Oct. 27, 2006  (NL) ..................................... 1032761

(51) Int. Cl.
*G06K 9/00*   (2006.01)
*G01N 21/86*  (2006.01)
*G02B 13/22*  (2006.01)

(52) U.S. Cl. ........................ 382/151; 382/141; 382/149; 382/218; 382/286; 382/307; 250/559.29; 250/559.3; 348/86; 348/92; 348/95; 359/663

(58) Field of Classification Search .................. 348/86, 348/92, 95, 125; 250/559.29, 559.3; 382/141, 382/149, 151, 218, 286, 307; 359/663
See application file for complete search history.

(56) References Cited

U.S. PATENT DOCUMENTS

| | | | | |
|---|---|---|---|---|
| 4,914,513 A | * | 4/1990 | Spigarelli et al. | 348/87 |
| 5,113,565 A | * | 5/1992 | Cipolla et al. | 382/151 |
| 5,251,266 A | * | 10/1993 | Spigarelli et al. | 382/151 |
| 6,195,454 B1 | * | 2/2001 | Yazawa | 382/151 |
| 6,457,232 B1 | * | 10/2002 | Isogai et al. | 382/151 |
| 6,466,257 B1 | * | 10/2002 | Baugh et al. | 382/151 |
| 6,647,138 B1 | * | 11/2003 | Sakaguchi | 382/151 |
| 6,938,335 B2 | * | 9/2005 | Kuribayashi et al. | 382/151 |

FOREIGN PATENT DOCUMENTS

| | | |
|---|---|---|
| DE | 100 12 043 A1 | 10/2001 |
| JP | 11 121999 A | 4/1999 |
| JP | 2001 217599 A | 8/2001 |
| WO | WO 2004/064472 A1 | 7/2004 |

* cited by examiner

*Primary Examiner*—Evelyn A. Lester
(74) *Attorney, Agent, or Firm*—Foley & Lardner LLP

(57) ABSTRACT

A device comprises an imaging device, a placement element connected to the imaging device for placing a component on a substrate, as well as an optical system having an optical axis. The placement element and the imaging device can be jointly moved relative to the optical system to at least a position in which the optical axis is located between the imaging device and the placement element, wherein the position of a component supported by the placement element can be detected by means of the imaging device. The optical system is telecentric at least in an image space located near the imaging device as well as in an object space located near the placement element.

5 Claims, 6 Drawing Sheets

DEVICE SUITABLE FOR PLACING COMPONENTS ON A SUBSTRATE

The invention relates to a device comprising an imaging device, a placement element connected to the imaging device for placing a component on a substrate, as well as an optical system having an optical axis, wherein the placement element and the imaging device can be jointly moved relative to the optical system to at least a position in which the optical axis is located between the imaging device and the placement element, wherein the position of a component supported by the placement element can be detected by means of the imaging device.

With such a device, which is known from International patent application WO-A1-2004/064472, a component is picked up by means of the placement element, which component is displayed on the imaging device by means of the optical system.

To that end the placement element and the imaging device are jointly moved to a position above a stationary optical system comprising two deflection mirrors arranged at an angle of 45° relative to the optical axis, as well as lenses disposed therebetween. The optical system further comprises a plate provided with marking elements. The placement element and the imaging device are so positioned relative to the optical system that one focal plane coincides with the marking plate and a second focal plane coincides with the component. In this position a joint image of the component and the marking elements is made by means of the imaging device.

From said image the position of the component relative to the marking elements can then be derived. If the position of the placement element was also known at the time of making the image, it is subsequently possible to determine the position of the component relative to the placement element.

Furthermore, an image of a part of a substrate can be made by means of the imaging device, after which the component can be accurately positioned at a desired spot on a substrate on the basis of the images made.

In order to be able to place relatively many components per unit time on a substrate, the placement element and the imaging device connected thereto need to be moved relatively quickly over the optical system.

A drawback of the known device is that the placement element and the imaging device need to be precisely positioned relative to the focal planes in order to obtain an accurate image.

The object of the invention is to provide a device by means of which the position of a component to be supported by the placement element can be detected relatively quickly and accurately.

This object is accomplished with the device according to the invention in that the optical system is telecentric at least in an image space located near the imaging device as well as in an object space located near the placement element.

Since the optical system is at least partially telecentric, the placement element and the imaging device need not be accurately aligned at least with respect to a focal plane. The optical system is telecentric to such an extent that the imaging device and the placement element need not be accurately aligned with respect to the two focal planes.

In this way it is possible to make an image of a component supported by the placement element relatively quickly and accurately by means of the imaging device. Furthermore, movement of the placement element and/or imaging device towards the optical system or away from the optical system will lead to less motion distortion.

Since the component need not be precisely positioned in a specific plane before an image can be made, the placement element, which is usually vertically adjustable with respect to the imaging device, need not take up a precisely defined position relative to the imaging device upon making an image.

One embodiment of the device according to the invention is characterised in that the optical system comprises at least two deflection mirrors arranged at an angle of 45° relative to the optical axis.

Such an optical system can be manufactured in a relatively simple manner with a high degree of precision.

Another embodiment of the device according to the invention is characterised in that the optical system comprises a prism, one plane of which extends transversely to the optical axis, whilst two planes adjacent to said plane form the deflection mirrors, as well as two lenses located on either side of the deflection mirrors, seen along the optical axis.

Such a prism can be manufactured with a high degree of precision, it can be stably mounted, it does not exhibit any loss of light and the deflection mirrors are insensitive to fouling. As a result of the greater optical density of glass, more mechanical space is created between the imaging lenses.

Yet another embodiment of the device according to the invention is characterised in that the device comprises at least one light source for illuminating the component under at least two different illumination angles.

When such a light source is used, the component is uniformly illuminated.

Yet another embodiment of the device according to the invention is characterised in that the imaging device is telecentric.

The advantage of this is that if the imaging device is also used for making an image of the substrate, said imaging device need not be accurately aligned with respect to the plane of the substrate, either, upon making an image of the substrate.

The imaging device preferably has an aperture angle comparable to that of the optical system. In this way comparatively little light is lost.

The invention will now be explained in more detail with reference to the drawings, in which:

FIG. 4a is a side view of another embodiment of the device shown in FIG. 1;

FIG. 4b is a top plan view of a part of the device shown in FIG. 4a; and

Like parts are indicated by the same numerals in the figures.

Figure 1:
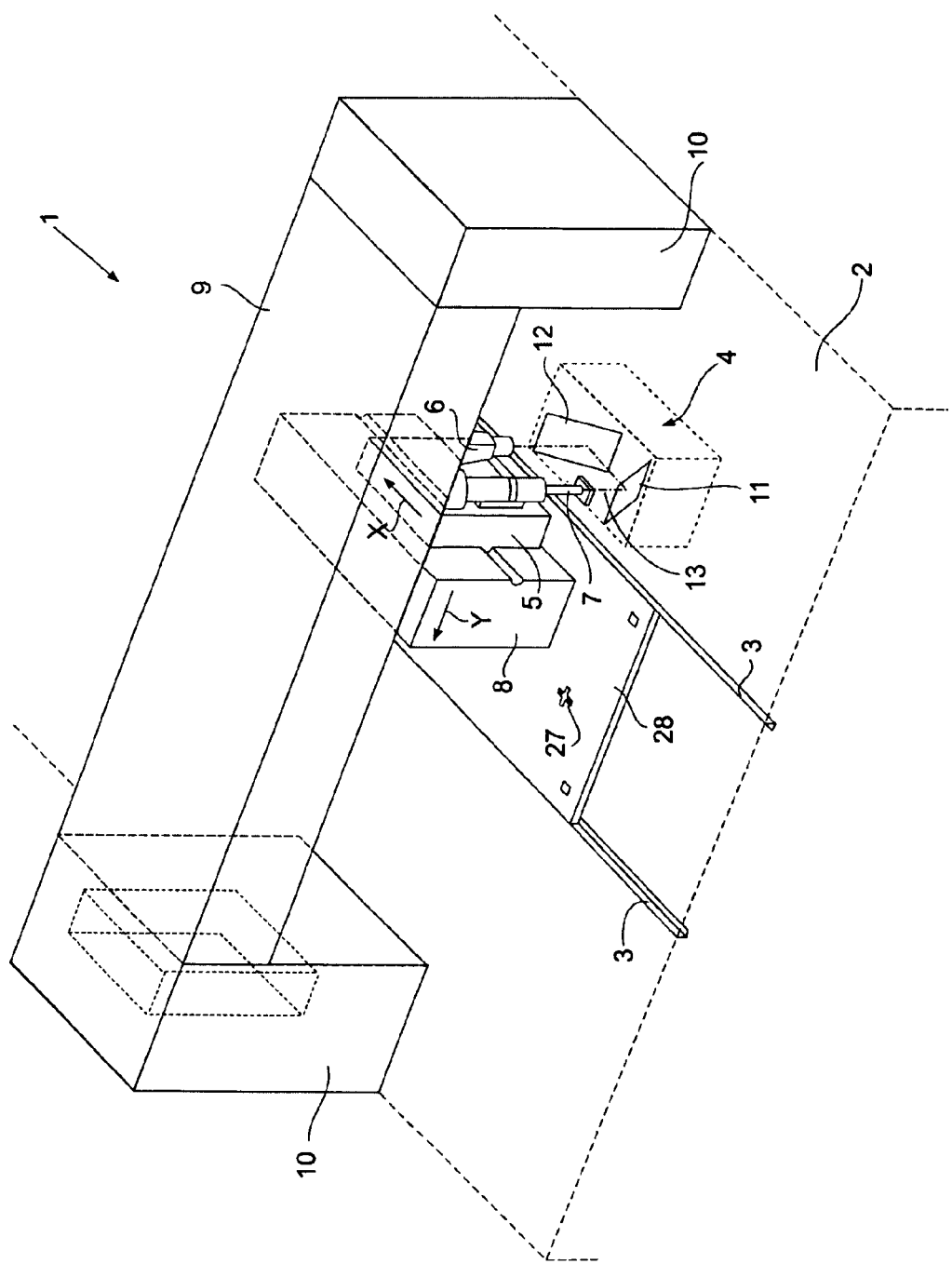
FIG. 1 is a perspective view of a device according to the invention.

FIG. 1 is a perspective view of a device 1 according to the invention, which comprises a frame 2, transport rails 3 supported by the frame 2, an optical system 4 positioned beside the transport rails 3 and a unit 5 that is movable above the transport rails 3 and the optical system 4, to which an imaging device 6 and a placement element 7 are connected. The optical system 4 is rigidly connected to the frame 2. The unit 5 can be moved in and opposite to the direction indicated by the arrow X relative to a slide 8. The slide 8 can be moved in and opposite to the direction indicated by the arrow Y relative to a U-shaped frame 9. The U-shaped frame 9 is supported on the frame 2 with two legs 10.

As FIG. 1 shows, the optical system 4 of the device according to the invention comprises two deflection mirrors 11, 12, which each include an angle of 45° with an optical axis 13 extending between the imaging device 6 and the placement element 7.

Figure 2:
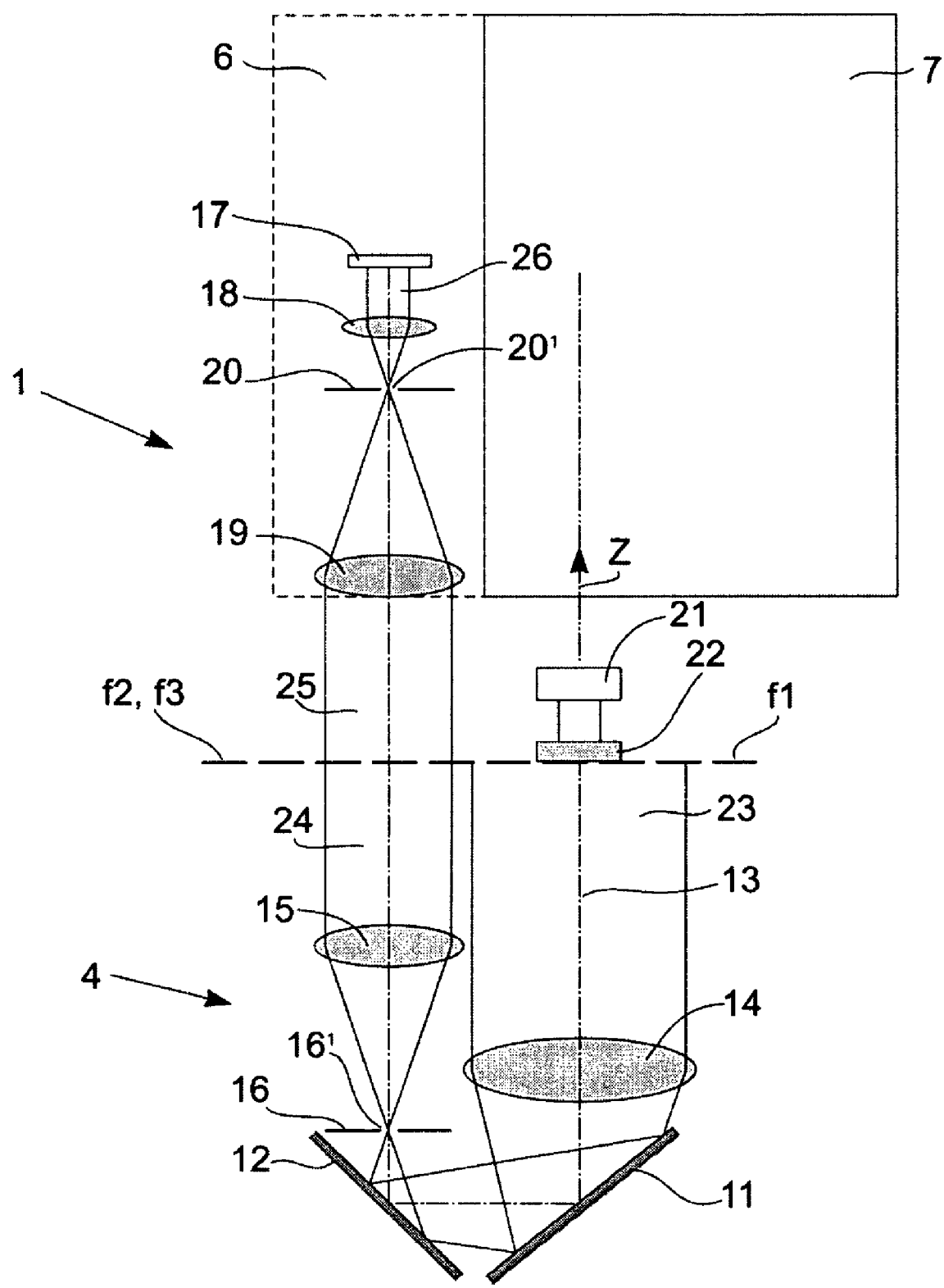
FIG. 2 is a side view of the device shown in FIG. 1.

FIG. 2 is a side view of the device 1 that is shown in FIG. 1, in which the imaging device 6, the placement element 7 and the optical system 4 are shown in more detail.

The optical system 4 comprises two lenses 14, 15 located on either side of the deflection mirrors 11, 12, seen along the optical axis 13, with the focal plane f1 of the lens 14 being positioned at the same height as the focal plane f2 of the lens 15. The optical system 4 further comprises a light beam stop plate 16, which extends transversely to the optical axis 13 and which is located between the two lenses 14, 15.

The imaging device 6 is provided with an image sensor 17 extending transversely to the optical axis 13, two lenses 18, 19 and a light beam stop plate 20 located between the lenses 18, 19. The stop plates 16, 20 are each provided with an aperture 16', 20' in a manner that is known per se.

In the position of the imaging device 6 relative to the optical system 4 that is shown in FIG. 2, the focal plane f3 of the imaging device 6 coincides with the focal plane f2 of the optical system 4.

The placement element 7 is provided with a nozzle 21 which is movable in and opposite to the direction indicated by the arrow Z, by means of which the component 22 can be picked up in a usual manner by means of a vacuum. In the position of the placement element 7 relative to the optical system 4 that is shown in FIG. 2, the component 22 is located in the focal plane f1.

The optical system 4 is telecentric both in an object space 23 located near the component 22 and in an image space 24 located near the imaging device 6.

The imaging device 6, too, is telecentric in an object space 25 located on a side of the lens 19 that faces towards the optical system 4 as well as in an image space 26 located between the image sensor 17 and the lens 18.

As a result, a component 22 located in the focal plane f1 is accurately displayed on the image sensor 17. However, also when the component 22 is located slightly above or below the focal plane f1, a comparatively accurate image of the component 22 on the image sensor 17 will be obtained. The same will happen when the imaging device 6 has been moved in the Z-direction relative to the optical system 4, so that the focal planes f2 and f3 do not coincide.

Using the imaging device 6, an image can be made also of a part 27 of a substrate 28 (see FIG. 1), on the basis of which the desired position of the components 22 on the substrate 28 can be accurately calculated. Because of the telecentricity of the optical system of the imaging device 6, the focal plane f3 need not precisely coincide with the surface of the substrate 28 upon making an image of the substrate.

Figure 3:
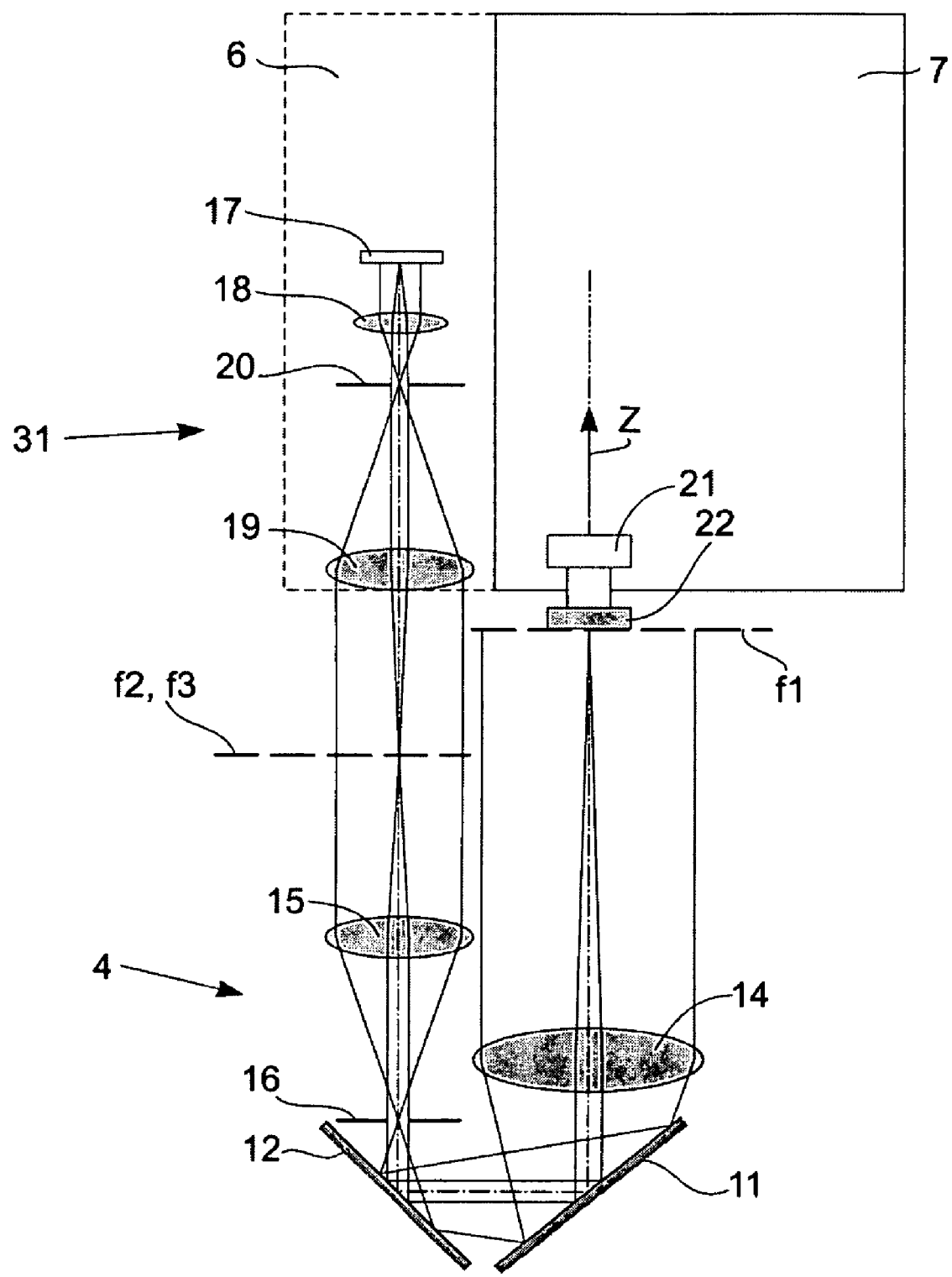
FIG. 3 is a side view of the device shown in FIG. 2 in another position thereof.

FIG. 3 shows a device 31 corresponding to the device shown in FIG. 2, which is different from the device 1 that is shown in FIG. 2 in that the focal planes f2, f3 are staggered relative to the focal plane f1. An advantage of such an arrangement is that after an image has been made, the component 22 can directly be moved in the X- and Y-directions to the desired position above the substrate 28. With the device that is shown in FIG. 1, the component 22 must first be moved in the Z-direction in order to prevent it from colliding with components that are already present on the substrate 28.

Figures 4A, 4B:
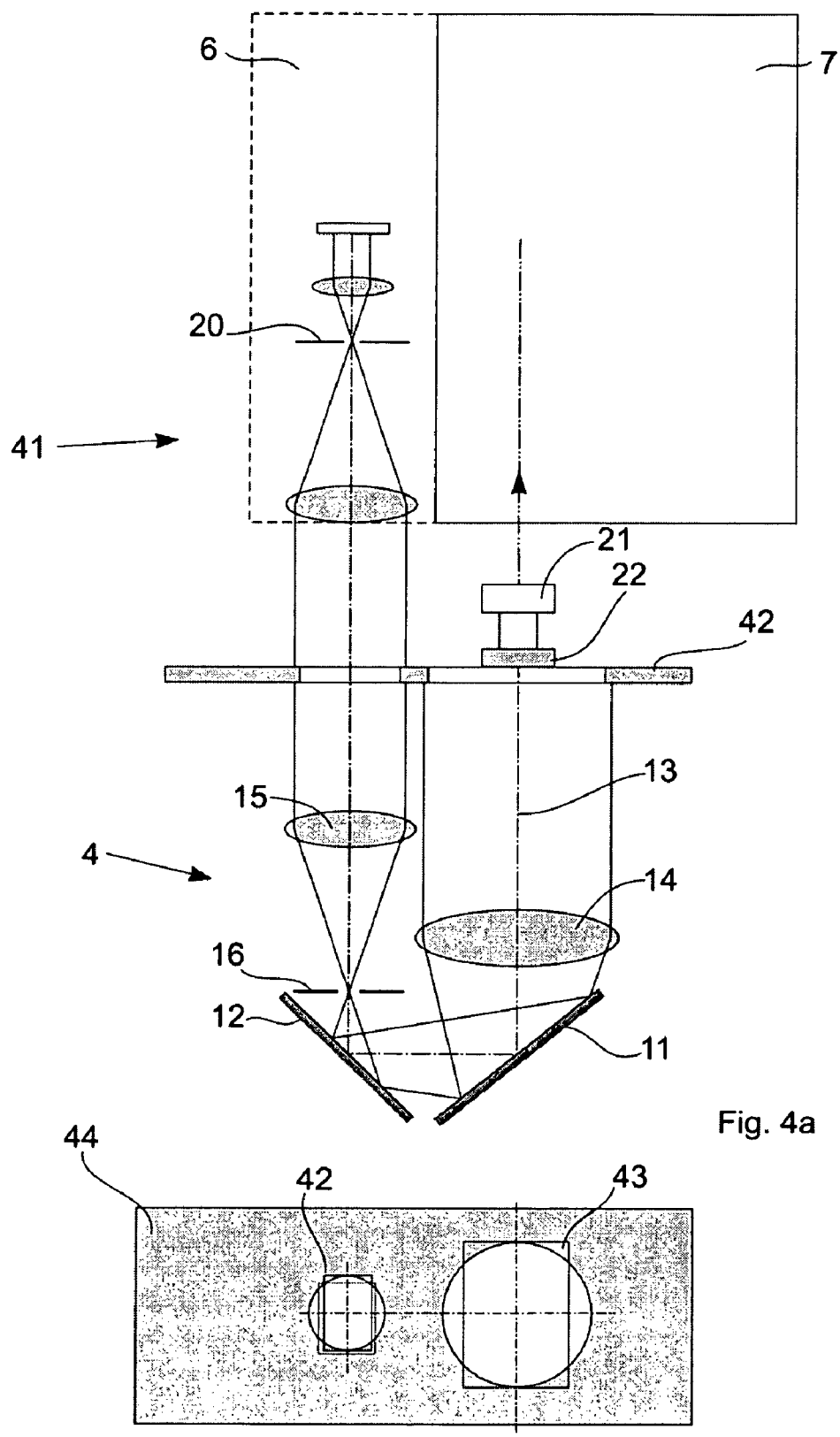

FIGS. 4a and 4b show a device 41 which is different from the device shown in FIG. 1 in that the device 41 comprises a marking plate 44 provided with marking elements 42, 43. Both the marking elements 42 and the marking elements 43 are detected by the imaging device.

The use of marking elements 42, 43 makes it possible in a simple manner to determine the positions of the imaging device 6 and the components 22 with respect to the marking elements 42, 43, which are fixedly connected to the marking plate 44, and thus with respect to the optical system 41. From said positions, the relative position of the components 22 with respect to the imaging device 6 can be determined, after which the component 22 can be precisely positioned on the substrate. The marking plate 44 is located in the focal planes f1, f2.

Figure 5:
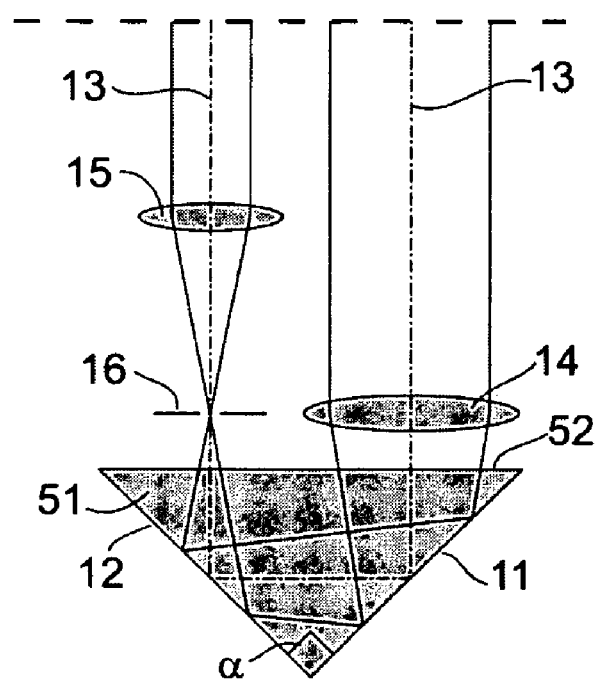
FIGS. 5-9 show various embodiments of the optical system of the device shown in FIG. 1.

FIG. 5 shows another embodiment of the device 1, in which the deflection mirrors 11, 12 form part of planes of a prism 51 and include an angle α of 90° with each other. The plane 52 opposite the deflection mirrors 11, 12 extends transversely to the optical axis 13 in this embodiment. The prism 51 can be manufactured in a relatively simple manner with a high degree of precision from plastic material or glass.

Figure 6:
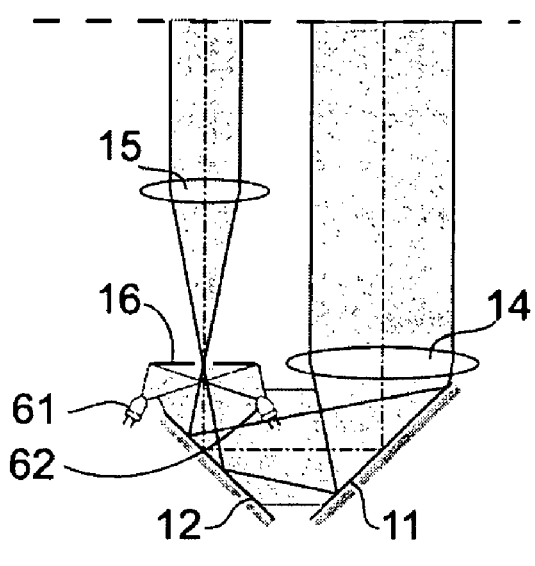
Figure 7:
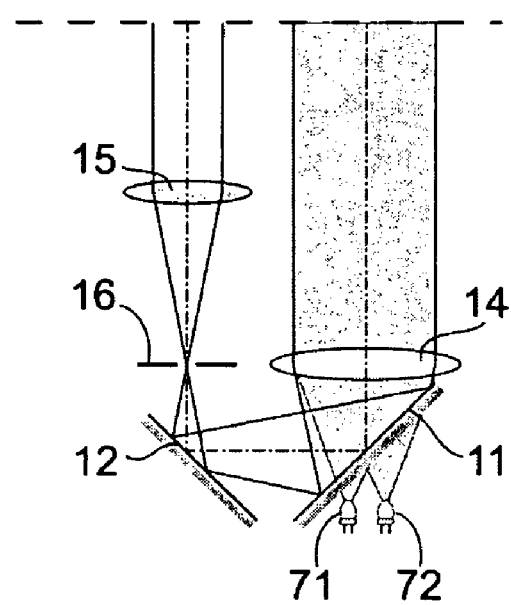
Figure 8:
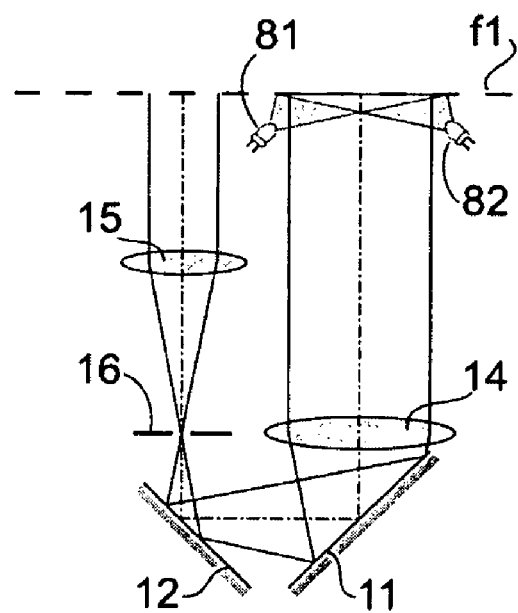

FIGS. 6-8 show different manners in which the illumination of the component 22 for obtaining a clear image which is rich in contrast can be realised.

FIG. 6 shows two LEDs 61, 62 arranged at an angle opposite the light beam stop plate.

The light sources 61, 62 shine light on an underside of the light beam stop plate 16. The light is reflected by the plate 16 and beamed in the direction of the object 22 via the deflection mirrors 11, 12. Since the light sources 61, 62 are arranged at an angle, a uniform illumination of the components 22 is obtained. The light sources 61, 62 preferably act as flashlights, with the flash time of the light sources 61, 62 being shorter than the shutter time of the image sensor 17. In this way motion distortion caused by movement of the imaging device 7 and the placement element 6 relative to the optical system 4 is prevented in a simple manner. In the case of image sensors having a comparatively short shutter time it is possible to keep the light sources 61, 62 on continuously.

In the embodiment of FIG. 7, the light sources are located on a side of the deflection mirrors 11 remote from the lens 14, whilst the deflection mirror 11 is configured as a semi-transparent mirror. The light from the light sources 71, 72 passes through the deflection mirror 11 and is uniformly led to the component 22.

FIG. 8 shows an embodiment in which light sources 81, 82 are disposed close to the focal plane f1.

Figure 9:
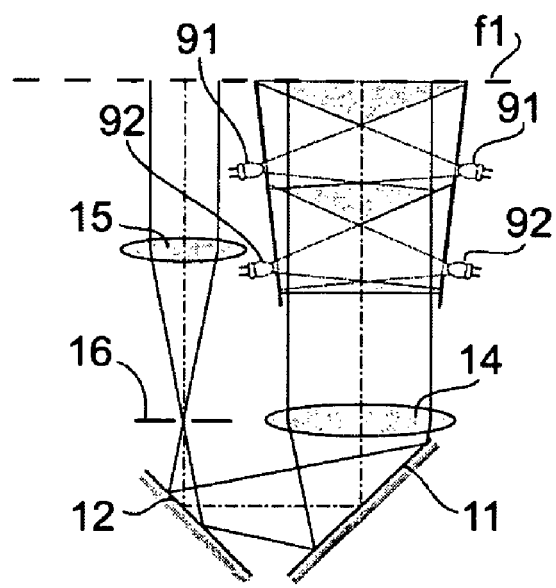

FIG. 9 shows an embodiment in which two rings 91, 92 with light sources are disposed near the focal plane f1.

The imaging device 6 and the placement element 7, as well as the optical system 4, may be oriented in the Y-direction instead of in the X-direction as in FIG. 1.

The invention claimed is:

1. A device comprising an imaging device, a placement element connected to the imaging device for placing a component on a substrate, as well as an optical system having an optical axis, wherein the placement element and the imaging device can be jointly moved relative to the optical system to at least a position in which the optical axis is located between the imaging device and the placement element, wherein the position of a component supported by the placement element can be detected by means of the imaging device, characterized in that the optical system is telecentric at least in an image space located near the imaging device as well as in an object space located near the placement element.

2. A device according to claim 1, characterized in that the optical system comprises at least two deflection mirrors arranged at an angle of 45° relative to the optical axis.

3. A device according to claim 2, characterized in that the optical system comprises a prism, one plane of which extends transversely to the optical axis, whilst two planes adjacent to said plane form the deflection mirrors, as well as two lenses located on either side of the deflection mirrors, seen along the optical axis.

4. A device according claim 1, characterized in that the device comprises as least one light source for illuminating the component under at least two different illumination angles.

5. A device according claim 1, characterized in that said imaging device is telecentric.

* * * * *